United States Patent
Smeys et al.

(10) Patent No.: US 9,611,137 B2
(45) Date of Patent: Apr. 4, 2017

(54) MEMS SENSOR INTEGRATED WITH A FLIP CHIP

(71) Applicant: InvenSense, Inc., San Jose, CA (US)

(72) Inventors: Peter Smeys, San Jose, CA (US); Mozafar Maghsoudnia, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/559,715

(22) Filed: Dec. 3, 2014

(65) Prior Publication Data

US 2016/0060100 A1 Mar. 3, 2016

Related U.S. Application Data

(60) Provisional application No. 62/042,135, filed on Aug. 26, 2014.

(51) Int. Cl.
*H01L 23/12* (2006.01)
*B81B 7/00* (2006.01)
*B81C 1/00* (2006.01)

(52) U.S. Cl.
CPC .............. *B81B 7/007* (2013.01); *B81B 7/008* (2013.01); *B81C 1/00238* (2013.01)

(58) Field of Classification Search
CPC ........ H01L 33/644; B81B 7/008; B81B 7/007
(Continued)

(56) References Cited

U.S. PATENT DOCUMENTS 7,312,505 B2 * 12/2007 Kipnis .................. B81C 1/0023
257/414
8,587,077 B2 * 11/2013 Chen ................... B81C 1/00238
257/254
(Continued)

FOREIGN PATENT DOCUMENTS

CN 103818874 A 5/2014
TW 201348122 A 12/2013
(Continued)

OTHER PUBLICATIONS

The International Search Report and the Written Opinion of the International Searching Authority for International Application No. PCT/US2015/044086, mailed Nov. 13, 2015.
(Continued)

*Primary Examiner* — Tuan Nguyen
(74) *Attorney, Agent, or Firm* — Amin, Turocy & Watson, LLP

(57) ABSTRACT

A method and system for providing a MEMS sensor integrated with a flip chip are disclosed. In a first aspect, the system comprises a MEMS sensor, at least one flip chip coupled to the MEMS sensor, and at least one through-silicon via (TSV) that electrically connects the at least one flip chip to the MEMS sensor. In a second aspect, the system comprises a MEMS sensor that includes a CMOS coupled to a MEMS structure, wherein the CMOS comprises a substrate coupled to an interconnect in contact with the MEMS structure. The system further comprises a plurality of flip chips coupled to the substrate, a plurality of TSV that electrically connect the plurality of flip chips to the interconnect, and a plurality of layers on the substrate to provide electrical connections between the plurality of flip chips and from the plurality of flip chips to at least one external component.

17 Claims, 3 Drawing Sheets

(58) Field of Classification Search
USPC .................................................. 257/704, 415
See application file for complete search history.

(56) References Cited

U.S. PATENT DOCUMENTS

| | | | | |
|---|---|---|---|---|
| 8,604,603 | B2* | 12/2013 | Lau | ........................ H01L 23/055 |
| | | | | 257/686 |
| 8,698,258 | B2* | 4/2014 | Nagarkar | .............. B81B 3/0081 |
| | | | | 257/414 |
| 2005/0218509 | A1 | 10/2005 | Kipnis et al. | |
| 2011/0108933 | A1* | 5/2011 | Nakatani | ............. B81C 1/00238 |
| | | | | 257/415 |
| 2012/0142144 | A1* | 6/2012 | Taheri | ..................... B81B 7/007 |
| | | | | 438/107 |
| 2013/0168740 | A1 | 7/2013 | Chen | |
| 2014/0203379 | A1* | 7/2014 | Teh | ........................ B81B 7/0006 |
| | | | | 257/415 |
| 2015/0028432 | A1* | 1/2015 | Kim | ........................ B81B 3/001 |
| | | | | 257/415 |

FOREIGN PATENT DOCUMENTS

| | | | | | |
|---|---|---|---|---|---|
| WO | WO 2007/060289 | * | 5/2007 | ............... | B81C 3/00 |
| WO | WO 2013/062533 | * | 5/2013 | ............. | H01L 23/48 |

OTHER PUBLICATIONS

Taiwanese Office Action dated Aug. 25, 2016 for Taiwanese Application No. 104126128, 11 pages (including translation).

* cited by examiner

MEMS SENSOR INTEGRATED WITH A FLIP CHIP

CROSS REFERENCE

This application claims benefit under 35 USC 119(e) of U.S. Provisional Patent Application No. 62/042,135, filed on Aug. 26, 2014, entitled "INTEGRATED MEMS SENSOR WITH FLIP-CHIP COMPONENTS," which is incorporated herein by reference in its entirety.

FIELD OF THE INVENTION

The present invention relates to microelectromechanical system (MEMS) sensors, and more particularly, to an integrated MEMS sensor and flip chip components.

BACKGROUND

Conventional microelectromechanical system (MEMS) sensors that are integrated with other components have larger package form factors (size and height) due to wire-bonded connections or side by side integration of components on the package substrate. Therefore, there is a strong need for a solution that overcomes the aforementioned issues. The present invention addresses such a need.

SUMMARY OF THE INVENTION

A method and system for providing a MEMS sensor integrated with at least one flip chip are disclosed. In a first aspect, the system comprises a MEMS sensor, at least one flip chip coupled to the MEMS sensor, and at least one through-silicon via (TSV) configured to allow for an electrical connection between the at least one flip chip and the MEMS sensor.

In a second aspect, the system comprises a MEMS sensor that includes a CMOS structure coupled to a MEMS structure, wherein the CMOS structure comprises a substrate coupled to an interconnect that is in contact with the MEMS structure. The system further comprises a plurality of flip chips coupled to the substrate, a plurality of TSV that electrically connect the plurality of flip chips and the interconnect, and a plurality of layers on the substrate to provide electrical connections between the plurality of flip chips and from the plurality of flip chips to at least one external component.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

The present invention relates to microelectromechanical system (MEMS) sensors, and more particularly, to an integrated MEMS sensor and flip chip components. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Micro-Electro-Mechanical Systems (MEMS) refers to a class of devices fabricated using semiconductor-like processes and exhibiting mechanical characteristics such as the ability to move or deform. MEMS often, but not always, interact with electrical signals. A MEMS device (or MENS sensor) may refer to a semiconductor device implemented as a microelectromechanical system. A MEMS device includes mechanical elements and optionally includes electronics for sensing. MEMS devices include but are not limited to gyroscopes, accelerometers, magnetometers, and pressure sensors.

A system and method in accordance with the present invention provides a MEMS sensor that can integrate with more advanced technologies including but not limited to flip chip components. In one embodiment, the flip chip components are integrated on a top side of the MEMS sensor thereby reducing the form factor of the package (size and height), eliminating tab dicing processes, and providing a high performance interconnect between the system on a chip (SOC) die (flip chip component) and the MEMS sensor. Flip chip components enable interconnections between semiconductor devices (e.g., MEMS sensor) to external circuitry via solder bumps/balls that are deposited on pads of the semiconductor device.

To describe the features of the present invention in more detail, refer now to the following description in conjunction with the accompanying Figures.

Figure 1:
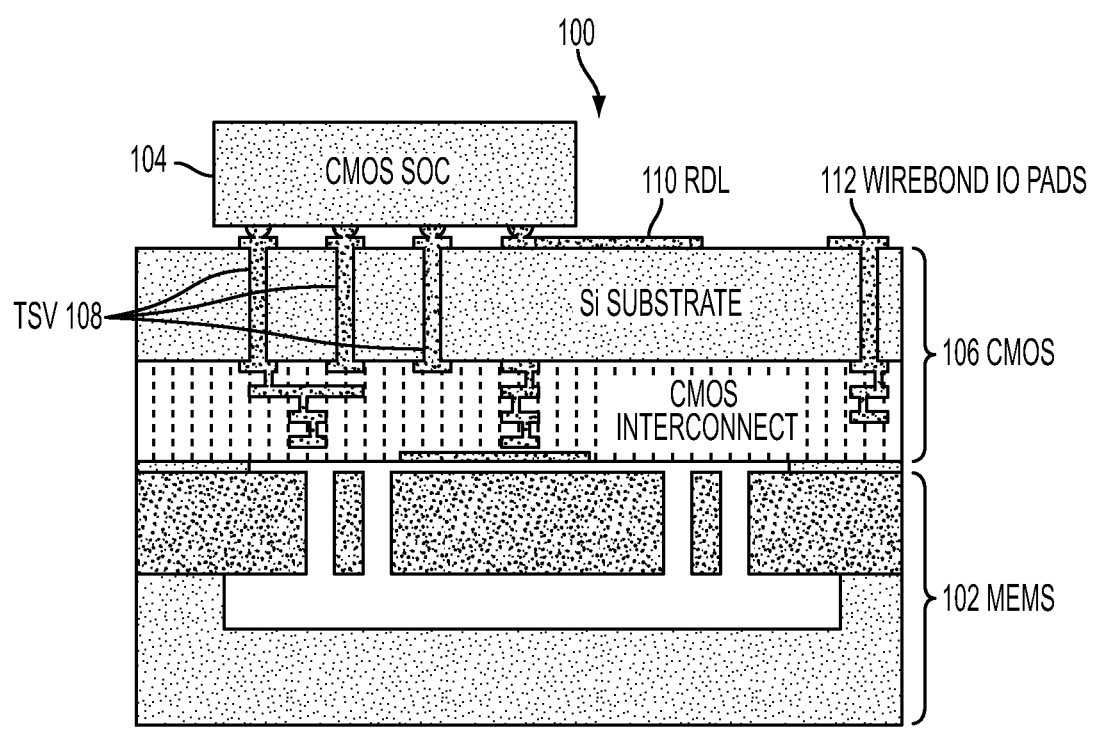
FIG. 1 illustrates a side view of a device that includes a MEMS sensor integrated with a flip chip component in accordance with an embodiment.

FIG. 1 illustrates a side view of a device 100 that includes a MEMS sensor 102 integrated with at least one flip chip component ("flip chip") 104 in accordance with an embodiment. In one embodiment, the MEMS sensor 102 includes a CMOS 106 that comprises a substrate (e.g., a silicon (Si) substrate) and an interconnect. In one embodiment, the CMOS 106 is 0.18 microns (um) in height. In one embodiment, the at least one flip chip component 104 is a CMOS system on a chip (SOC) that is integrated on a top side of the MEMS sensor 102. In another embodiment, the at least one flip chip component 104 is another sensor with different size characteristics. One of ordinary skill in the art readily recognizes that the at least one flip chip component 104 can be a variety of other types of devices and sensors with varying sizes and specifications and that would be within the spirit and scope of the present invention.

In one embodiment, the at least one flip chip component 104 is integrated on the top side of the MEMS sensor 102 utilizing a plurality of Through-Silicon Via (TSVs) 108 that connects each of the plurality of TSVs 108 to a sensor at metal layer one (M1) of a sensor circuit including but not limited to a CMOS of a MEMS sensor. In FIG. 1, three separate TSV are illustrated as the plurality of TSVs 108 but the device 100 can include a lesser or greater number of TSV.

In one embodiment, each TSV 108 can be made of a variety of materials including but not limited to copper and aluminum and each TSV 108 is connected through the CMOS substrate of the CMOS 106 and to the M1 of the CMOS interconnect of the CMOS 106. In FIG. 1, at least one redistribution layer (RDL layer) 110 is located on the Si substrate of the top side of the MEMS sensor 102. The at least one RDL layer 110 is utilized for escape routing of the at least one flip chip component 104 to a plurality of wirebond IO pads 112 also located on the Si substrate of the top side of the MEMS sensor 102. Therefore, while each TSV of the plurality of TSVs 108 connects the at least one flip chip component 104 to the MEMS sensor 102, the at least one RDL layer 110 connects the at least one flip chip component 104 to another component (e.g., to another flip chip or to an external component/device/sensor). The at least one flip chip component 104 includes a plurality of solder bumps or balls that are connected to at least a portion of the plurality of TSVs 108 for integration into the CMOS 106 of the MEMS sensor 102.

By providing a system that replaces wirebond/substrate routing based connections with TSV based connections, the device 100 provides a high performance interconnect between the at least one flip chip component 104 (e.g., SOC die) and the MEMS sensor 102 in a reduced form factor and package size. Redistribution layers (RDL) are utilized not only to connect the at least one flip chip component 104 to the plurality of wirebond IO pads 112 but also to connect the at least one flip chip component 104 to the CMOS 106 itself and/or to connect a plurality of flip chip components to each other for communication purposes.

Figure 2:
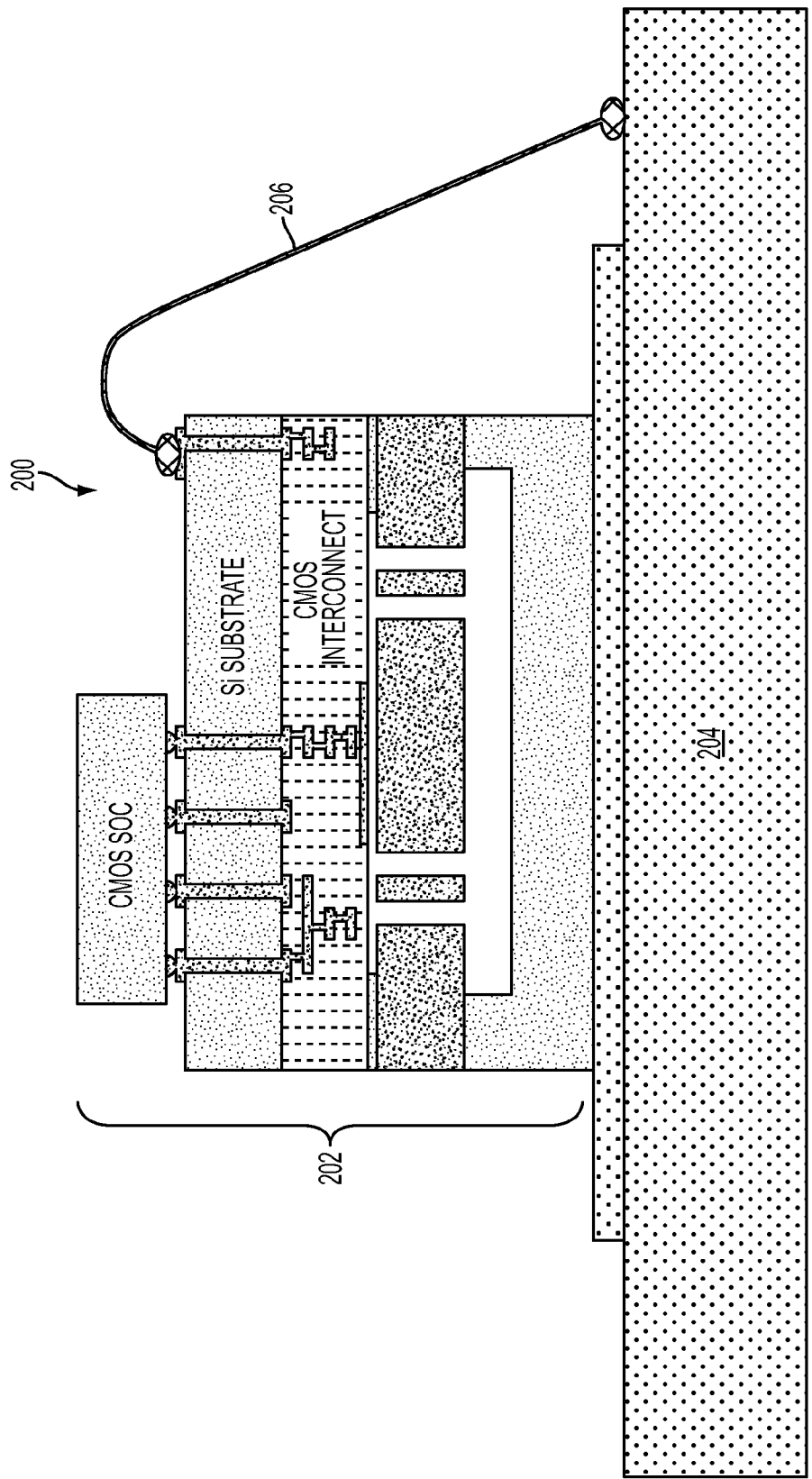
FIG. 2 illustrates a side view of a device that includes a MEMS sensor coupled to a package substrate in accordance with an embodiment.

FIG. 2 illustrates a side view of a device 200 that includes a MEMS sensor 202 coupled to a package substrate 204 in accordance with an embodiment. The MEMS sensor 202 includes the same components as the MEMS sensor 102 and has been integrated with a flip chip component (e.g., CMOS SOC). The MEMS sensor 202 is coupled to the package substrate 204 via wirebonding 206.

Figure 3:
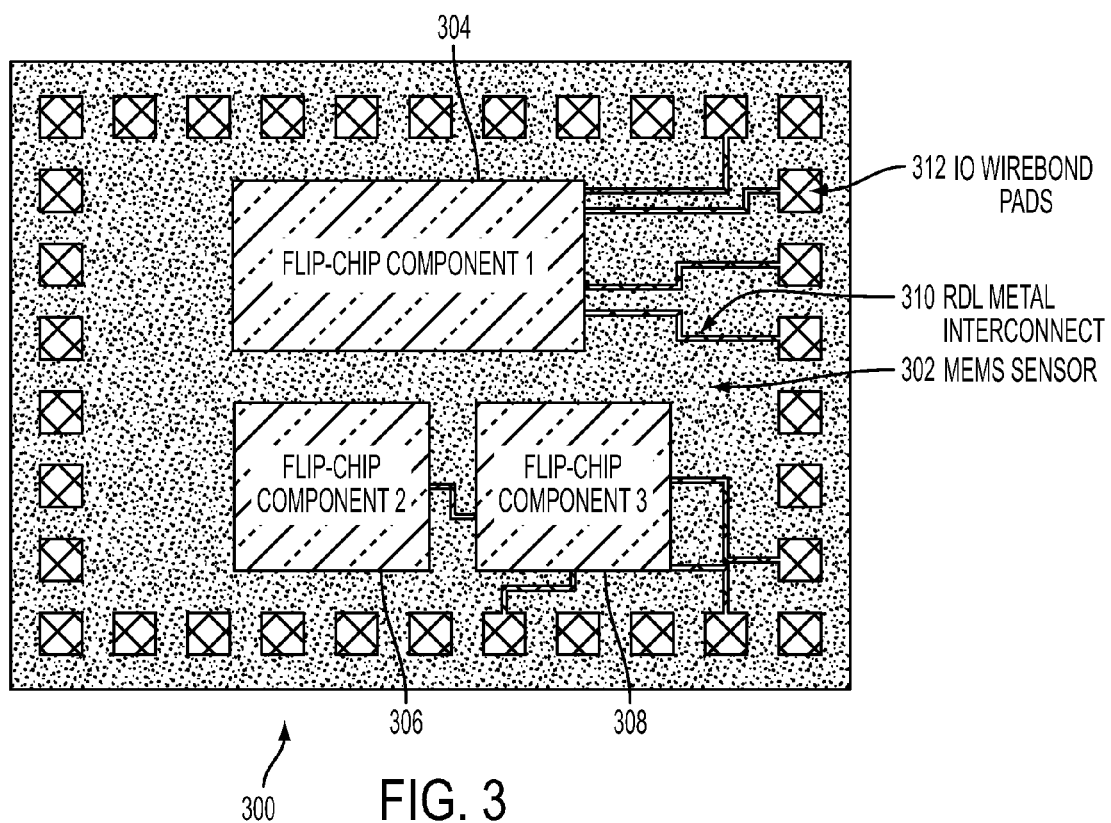
FIG. 3 illustrates a top view of a device that includes a MEMS sensor integrated with a plurality of flip chip components in accordance with an embodiment.

FIG. 3 illustrates a top view of a device 300 that includes a MEMS sensor 302 integrated with a plurality of flip chip components 304-308 in accordance with an embodiment. The plurality of flip chip components 304-308 are integrated with the MEMS sensor 302 using a plurality of redistribution layer (RDL) metal interconnects 310 that connect the plurality of flip chip components 304-308 to a plurality of wirebond IO pads 312. In one embodiment, the plurality of RDL metal interconnects 310 are made of a variety of materials including but not limited to aluminum. Based upon the size of MEMS sensor and the size and specifications of the plurality of flip chip components, the plurality of flip chip components can be integrated with the MEMS sensor in various configurations.

In FIG. 3, the MEMS sensor 302 is integrated with a first flip chip component 304 via four separate RDL metal interconnects of the plurality of RDL metal interconnects 310 that each connect the first flip chip component 304 to four separate wirebond IO pads of the plurality of wirebond IO pads 312. The MEMS sensor 302 is also integrated with a third flip chip component 308 via three separate RDL metal interconnects (that are also separate from the four RDL metal interconnects that integrate the first flip chip component 304 to the MEMS sensor 302) of the plurality of RDL metal interconnects 310. The MEMS sensor 302 is also integrated with a second flip chip component 306 via the third flip chip component 308 and one separate RDL metal interconnect of the plurality of RDL metal interconnects 310 to enable communication between the second and third flip chip components 306-308.

Therefore, each of the plurality of RDL metal interconnects 310 can either connect flip chip components to any of the plurality of wirebond IO pads 312, connect a CMOS sensor to any of the plurality of wirebond IO pads 312, or connect the flip chip components to each other. As aforementioned, the MEMS sensor 302 can be integrated with the plurality of flip chip components 304-308 via numerous configurations of RDL metal interconnects and wirebond IO pads.

The method and system in accordance with the present invention provides a first device that comprises a microelectromechanical system (MEMS) sensor, at least one flip chip coupled to the MEMS sensor, and at least one through-silicon via (TSV) configured to allow for an electrical connection between the at least one flip chip and the MEMS sensor. In one embodiment, the at least one flip chip is a CMOS system on a chip (SOC) that is coupled to or integrated with a top side of the MEMS sensor. The MEMS sensor includes a complementary metal-oxide-semiconductor (CMOS) that comprises a silicon (Si) substrate and a CMOS interconnect. The at least one TSV connects the at least one flip chip to a metal layer one (M1) of the CMOS interconnect.

In one embodiment, the first device further comprises at least one layer (including but not limited to at least one redistribution layer (RDL) metal interconnect) on a substrate (e.g., the Si substrate of the CMOS) of the MEMS sensor. The at least one layer provides electrical connections from the at least one flip chip to any of package pins, wirebond IO pads, other flip chips, and external components whereas the TSV provides an electrical connection between the flip chip and the MEMS sensor as aforementioned.

In one embodiment, there are more than one (or a plurality of) flip chips integrated with the MEMS sensor. In this embodiment, the at least one layer provides electrical connections between any of at least two of the plurality of flip chips and a plurality of solder balls/bumps on a single flip chip of the plurality of flip chips (thereby providing electrical connections for the flip chip itself) and also provides electrical connections from at least one of the plurality of flip chips to any of at least one or a plurality of wirebond IO pads of the MEMS sensor and another external component.

In another embodiment, the method and system in accordance with the present invention provides a second device that comprises a MEMS sensor, wherein the MEMS sensor comprises a CMOS structure coupled to a MEMS structure, wherein the CMOS structure comprises a substrate coupled to an interconnect that is in contact with the MEMS structure. The device further comprises a plurality of flip chips coupled to the substrate, a plurality of through-silicon via (TSV) (e.g., TSV made of any of copper and aluminum) configured to allow for electrical connections between the plurality of flip chips and the interconnect, and a plurality of layers (e.g., a plurality of redistribution layer (RDL) metal interconnects made of aluminum) on the substrate to provide electrical connections between the plurality of flip chips and from the plurality of flip chips to at least one external component.

In this embodiment, each of the plurality of TSV connects one of the plurality of flip chips to one metal layer one (M1) portion of the interconnect. The plurality of layers provides electrical connections between at least two of the plurality of flip chips and between a plurality of solder balls on a single flip chip of the plurality of flip chips and also provides electrical connections from at least one of the plurality of flip chips to any of at least one wirebond IO pad of the MEMS sensor and an external component.

As above described, a system (MEMS sensor) and a method in accordance with the present invention provides a MEMS sensor that integrates flip chip components utilizing Through-Silicon Via (TSV) and redistribution layers (RDL).

By providing a device that replaces wirebond/substrate routing based connections with TSV based connections, the method and system in accordance with the present invention provides a high performance interconnect between the at least one flip chip component (e.g., SOC die) and the MEMS sensor. In addition, the method and system in accordance with the present invention eliminates tab dicing processes and provides form factor reduction of the package (size and height) as compared to devices that include wirebond only connections or side by side integration of components on package substrates.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A device comprising:
a microelectromechanical system (MEMS) structure;
a complementary metal-oxide semiconductor (CMOS) structure coupled to the MEMS structure, wherein the CMOS structure comprises a silicon substrate coupled to a CMOS interconnect that is in contact with the MEMS structure;
at least one flip chip coupled to the silicon substrate, wherein the silicon substrate is located between the at least one flip chip and the CMOS interconnect;
at least one through-silicon via (TSV) in direct contact with the CMOS interconnect at a first end and with the at least one flip chip at a second end to provide an electrical connection between the at least one flip chip and the interconnect; and
at least one layer on a substrate of the MEMS structure, wherein the at least one layer provides electrical connections from the at least one flip chip to at least one of package pins, another flip chip or an external component, wherein the at least one flip chip comprises a plurality of flip chips and the at least one layer provides electrical connections from at least one of the plurality of flip chips to at least one pad of the MEMS structure.

2. The device of claim 1, wherein the at least one flip chip is coupled to a top side of the CMOS structure.

3. The device of claim 1, wherein the at least one TSV connects the at least one flip chip to a metal layer one of the interconnect.

4. The device of claim 1, wherein the at least one layer is at least one redistribution layer metal interconnect.

5. The device of claim 1, wherein the at least one flip chip comprises a plurality of flip chips and the at least one layer provides electrical connections between at least two of the plurality of flip chips.

6. The device of claim 1, wherein the at least one flip chip comprises a plurality of flip chips and the at least one layer provides electrical connections between a plurality of solder balls on a single flip chip of the plurality of flip chips.

7. The device of claim 1, where the at least one pad is at least one wirebond input output pad.

8. The device of claim 1, wherein the at least one flip chip is a CMOS system on a chip (SOC).

9. A device comprising:
a microelectromechanical system (MEMS) sensor;
a complementary metal-oxide semiconductor (CMOS) structure coupled to the MEMS sensor, wherein the CMOS structure comprises a silicon substrate and a CMOS interconnect, and wherein the CMOS structure is connected to and below the silicon substrate;
a plurality of flip chips coupled to the silicon substrate, wherein the silicon substrate is located between the plurality of flip chips and the CMOS interconnect;
a plurality of through-silicon vias (TSVs) disposed through the silicon substrate of the CMOS structure and in direct contact with the CMOS interconnect and the plurality of flip chips to provide electrical connections between the plurality of flip chips and the CMOS interconnect; and
a plurality of layers on the silicon substrate to provide electrical connections between the plurality of flip chips and from the plurality of flip chips to at least one external component.

10. The device of claim 9, wherein the plurality of flip chips are coupled to a top side of the silicon substrate.

11. The device of claim 9, wherein each of the plurality of TSV connects one of the plurality of flip chips to one metal layer one portion of the interconnect.

12. The device of claim 9, wherein the plurality of layers is a plurality of redistribution layer (RDL) metal interconnects.

13. The device of claim 12, wherein the plurality of TSVs are composed of at least one of copper or aluminum and the plurality of RDL metal interconnects are composed of aluminum.

14. The device of claim 9, wherein at least one of the plurality of layers provides electrical connections between at least two of the plurality of flip chips.

15. The device of claim 9, wherein at least one of the plurality of layers provides electrical connections between a plurality of solder balls on a single flip chip of the plurality of flip chips.

16. The device of claim 9, wherein at least one of the plurality of layers provides electrical connections from at least one of the plurality of flip chips to at least one wirebond input output pad of the MEMS sensor.

17. The device of claim 9, wherein the at least one of the plurality of flip chips is a CMOS system on a chip (SOC).

* * * * *